(12) United States Patent
Kim et al.

(10) Patent No.: US 11,903,150 B2
(45) Date of Patent: Feb. 13, 2024

(54) HOUSING STRUCTURE AND FOLDABLE DISPLAY DEVICE HAVING THE SAME

(71) Applicant: Samsung Display Co., LTD., Yongin-si (KR)

(72) Inventors: Sang Jae Kim, Seongnam-si (KR); Ju Hee Song, Seoul (KR); Joong Gun Chong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 4 days.

(21) Appl. No.: 17/886,828

(22) Filed: Aug. 12, 2022

(65) Prior Publication Data

US 2023/0209735 A1 Jun. 29, 2023

(30) Foreign Application Priority Data

Dec. 23, 2021 (KR) ........................ 10-2021-0186026

(51) Int. Cl.
*H05K 5/00* (2006.01)

(52) U.S. Cl.
CPC .................................. *H05K 5/0018* (2022.08)

(58) Field of Classification Search
CPC ........................... H05K 5/0017; H05K 5/0217
USPC ......................................... 361/807, 809, 810
See application file for complete search history.

(56) References Cited

U.S. PATENT DOCUMENTS

| | | | |
|---|---|---|---|
| 10,481,634 B2 | 11/2019 | Mizoguchi et al. | |
| 2015/0062525 A1* | 3/2015 | Hirakata | G02F 1/133305 349/158 |
| 2015/0177789 A1* | 6/2015 | Jinbo | H04M 1/0268 313/511 |
| 2018/0138442 A1* | 5/2018 | Kim | G06F 3/041 |
| 2021/0041917 A1* | 2/2021 | Moon | G06F 1/1626 |

FOREIGN PATENT DOCUMENTS

| | | |
|---|---|---|
| KR | 1020160090471 A | 8/2016 |
| KR | 10-2060733 B1 | 12/2019 |
| KR | 1020200131662 A | 11/2020 |
| KR | 1020210083930 A | 7/2021 |

* cited by examiner

*Primary Examiner* — Hung S. Bui
(74) *Attorney, Agent, or Firm* — CANTOR COLBURN LLP

(57) ABSTRACT

A display device includes a display panel and a housing structure foldable together with each other, each including a first unfolded portion, a first folded portion, a second unfolded portion, a second folded portion and a third unfolded portion in order along a first direction, and first and second end portions respectively corresponding to outer edges of the third and second unfolded portions. The second end portion of the housing structure further includes a body portion, edge portions extended from the body portion and facing each other along a second direction, and a first protruding portion between the edge portions and protruded further from the edge portions in a direction away from the body portion. The display panel which is folded disposes the first protruding portion of the second end portion facing the display panel at the second unfolded portion thereof.

20 Claims, 6 Drawing Sheets

HOUSING STRUCTURE AND FOLDABLE DISPLAY DEVICE HAVING THE SAME

This application claims priority to Korean Patent Application No. 10-2021-0186026 filed on Dec. 23, 2021, and all the benefits accruing therefrom under 35 U.S.C. § 119, the entire contents of which are incorporated herein by reference.

BACKGROUND (a) Field

The present disclosure relates to a foldable display device.

(b) Description of the Related Art

Among various display devices such as a liquid crystal display (LCD), an organic light emitting diode (OLED) display, and a micro emissive display device, flexible display devices such as foldable display devices and rollable display devices that can be bent or folded have been developed. As such, a foldable or rollable flexible display device has the convenience of being portable and can provide a large-screen display portion during use thereof. Thus, the foldable or rollable flexible display device is in the spotlight as the next generation technology of the display device.

SUMMARY

A foldable display device may be repeatedly folded and unfolded at a folding portion of the display device, to be changed from having a small area when being carried and to providing a wide display area when unfolded during use thereof. However, the repeated folding and unfolding of the foldable display device may cause defects such as buckling in folding portion.

Embodiments provide a foldable display device that can suppress the progress of a defect in a portion adjacent to a folding portion of the foldable display device.

A display device according to an embodiment includes a display panel and a housing structure coupled with the display panel, where each of the display panel and the housing structure includes a plurality of unfolded portions including a first unfolded portion, a second unfolded portion, and a third unfolded portion, a first folding portion between the first unfolded portion and the second unfolded portion, a second folding portion between the second unfolded portion and the third unfolded portion, a first end portion at an edge of the third unfolded portion, and a second end portion at an edge of the first unfolded portion, where when the display panel is folded in the first folding portion, the second end portion faces a first portion in the second unfolded portion of the display panel, which is adjacent to the second folding portion, the second end portion includes a first body portion and a first horizontal portion facing the first body portion, and the first horizontal portion includes edge portions at opposite sides, and a first protruding portion between both edge portions and protruded below the edge portions.

The first protruding portion may protrude toward the first portion of the display panel.

The second unfolded portion of the housing structure may include a second protruding portion that is at opposite edges of the display panel.

When the display device is folded in the first folding portion, the second protruding portion may face the edge portion of the first horizontal portion.

When the display device is folded in the first folding portion, the second protruding portion may contact the edge portion of the first horizontal portion.

A thickness of the first protruding portion in a first direction may be smaller than a distance in the first direction between an upper surface of the display panel of the first portion and an upper surface of the second protruding portion.

When an upper surface of the first portion is normal, the first protruding portion may not contact the upper surface of the first portion when the display device is folded in the first folding portion.

When a defect occurs in the upper surface of the first portion, the first protruding portion may contact at least a part of the upper surface of the first portion when the display device is folded in the first folding portion.

The first protruding portion may include a side protruding portion that continues from the edge portion and protrudes in a different direction from the edge portion, and a lower protruding portion that continues with the side protruding portion and extends in a different direction from the side protruding portion.

The edge portion and the first protruding portion may together form a step shape.

A lower surface of the first protruding portion may be curved.

A modulus of the first protruding portion may be lower than a modulus of the upper surface of the first portion of the display panel.

The first folding portion may be folded first and then the second folding portion may be folded.

A curvature radius of the first folding portion may be smaller than a curvature radius of the second folding portion.

The housing structure of the plurality of unfolded portions may maintain a generally flat shape.

A display device according to an embodiment includes a first portion and a second portion that face each other when the display device is folded, and where the first portion includes a first housing structure that includes a first horizontal portion facing the second portion, the second portion includes a display panel and a second housing structure that surrounds a bottom surface and side surfaces of the display panel, the first horizontal portion includes edge portions at opposite sides, and a first protruding portion that is between the opposite edge portions and protrudes below the edge portions, the second housing structure includes second protruding portions at opposite edges of the display panel, and the second protruding portion faces the edge portions when the display device is folded.

The second protruding portion may contact the edge portions when the display device is folded.

A thickness of the first protruding portion in a first direction may be smaller than a distance in the first direction between an upper surface of the display panel of the second portion and an upper surface of the second protruding portion.

A modulus of the first protruding portion may be lower than a modulus of the upper surface of the display panel.

A display device according to an embodiment includes a display panel and a housing structure coupled with the display panel, where the housing structure includes a first end portion and a second end portion, and a first folding portion and a second folding portion that are between the first end portion and the second end portion, the second end portion includes a first protruding portion that faces an area adjacent to the second folding portion and an edge portion at an edge of the first folding portion when the first folding portion is folded, the housing structure further includes a second protruding portion that contacts the edge portion when the first folding portion is folded, and when the first folding portion is folded, the first protruding portion is separated from the upper surface of the facing display panel.

According to the embodiments, the progress of the defect in a portion adjacent to the folding portion of the foldable display device can be suppressed.

BRIEF DESCRIPTION OF THE DRAWINGS

The above and other advantages and features of this disclosure will become more apparent by describing in further detail embodiments thereof with reference to the accompanying drawings, in which.

DETAILED DESCRIPTION

Figure 1:
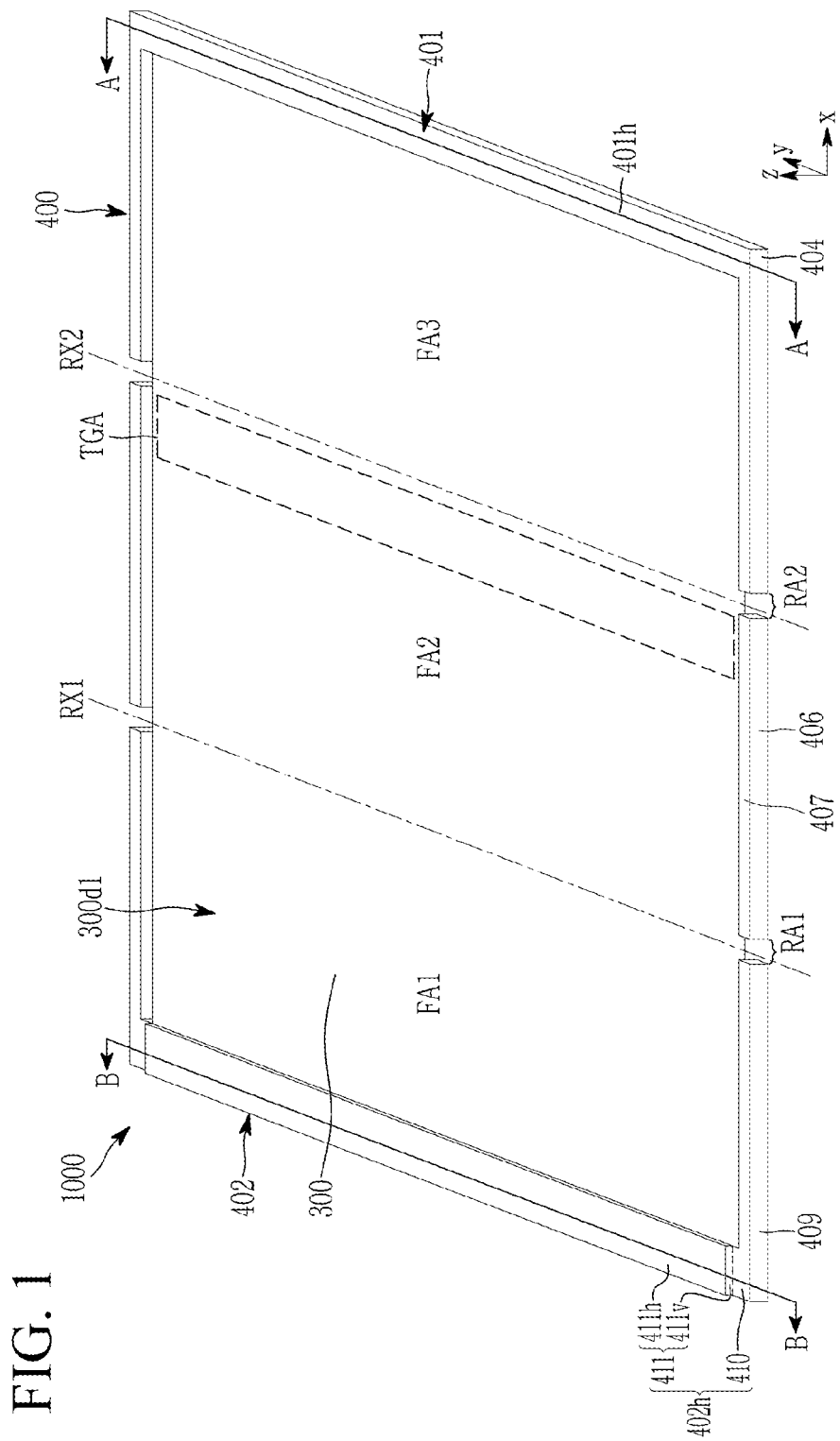
FIG. 1 is a perspective view of a display device in an unfolded state according to an embodiment.

The invention will be described more fully hereinafter with reference to the accompanying drawings, in which embodiments of the invention are shown. As those skilled in the art would realize, the described embodiments may be modified in various different ways.

The drawings and description are to be regarded as illustrative in nature and not restrictive. Like reference numerals designate like elements throughout the specification. As used herein, a reference number may indicate a singular element or a plurality of the element.

For example, a reference number labeling a singular form of an element within the drawing figures may be used to reference a plurality of the singular element within the text of specification.

In addition, since the size and thickness of each component shown in the drawing are arbitrarily indicated for better understanding and ease of description, the invention is not necessarily limited thereto. In the drawings, the thickness of layers, films, panels, regions, etc., are exaggerated for clarity. In the drawings, the thickness of layers, films, panels, regions, and the like are exaggerated for clarity.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise", and variations such as "comprises" or "comprising" will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Referring to FIG. 1 to FIG. 5, a display device 1000 according to an embodiment will be described. The display device 1000 may be a part of an electronic device, without being limited thereto.

Figure 2:
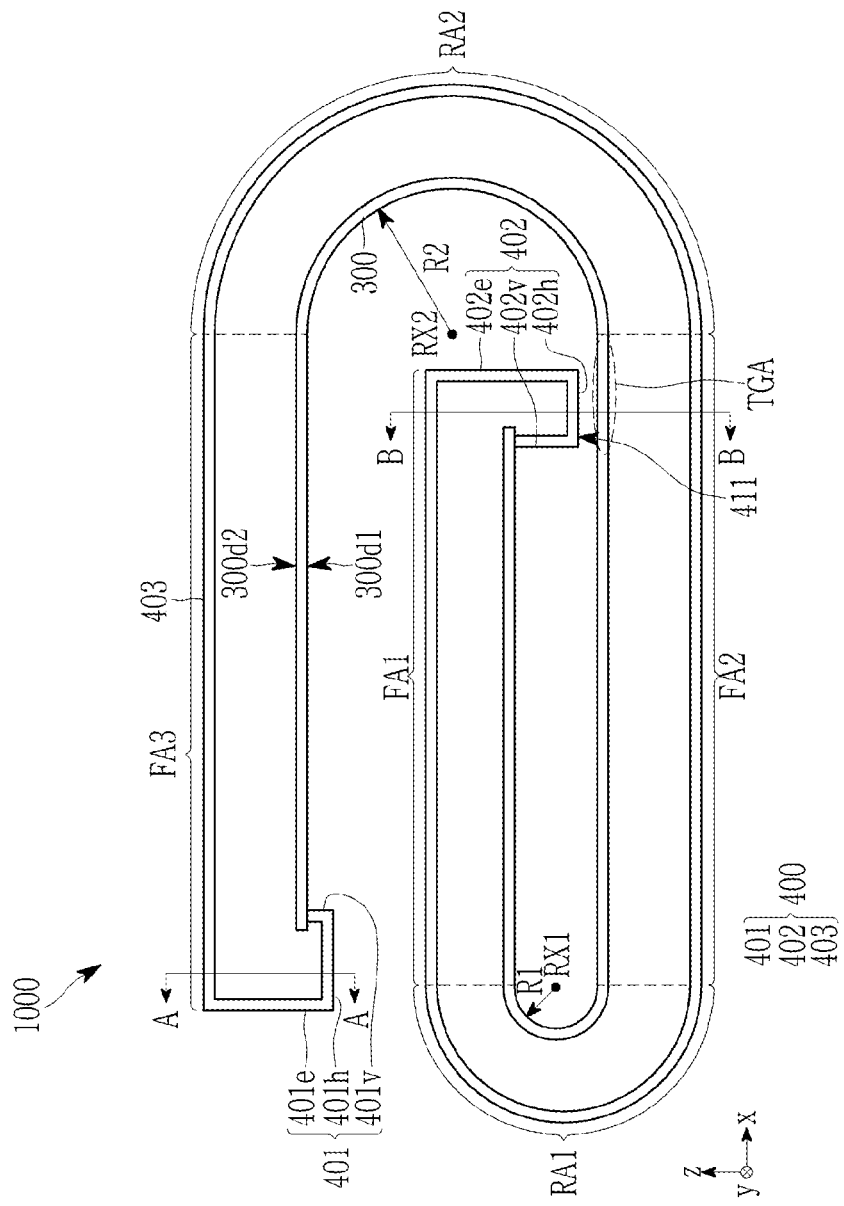
FIG. 2 is a side view of the display device in a folded state according to the embodiment.
Figure 3:
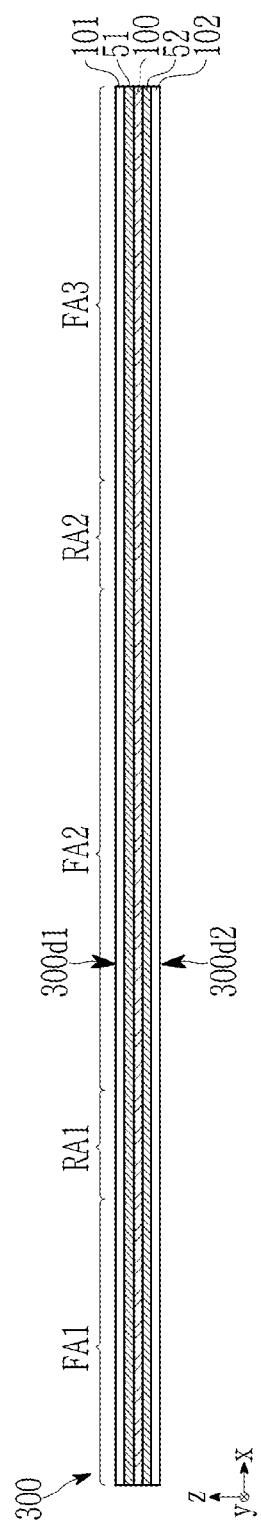
FIG. 3 is a cross-sectional view of a display panel of the display device when the display panel is unfolded.
Figure 4:
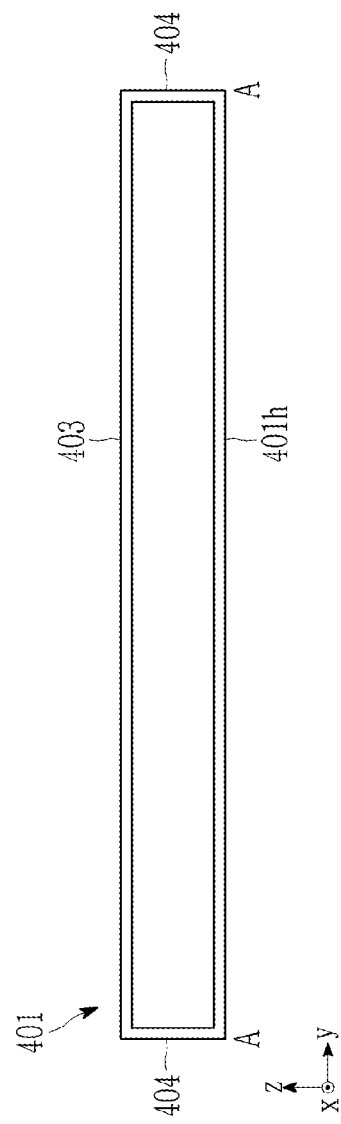
FIG. 4 is a cross-sectional view of the display device shown in FIG. 1 and FIG. 2, taken along line A-A.
Figure 5:
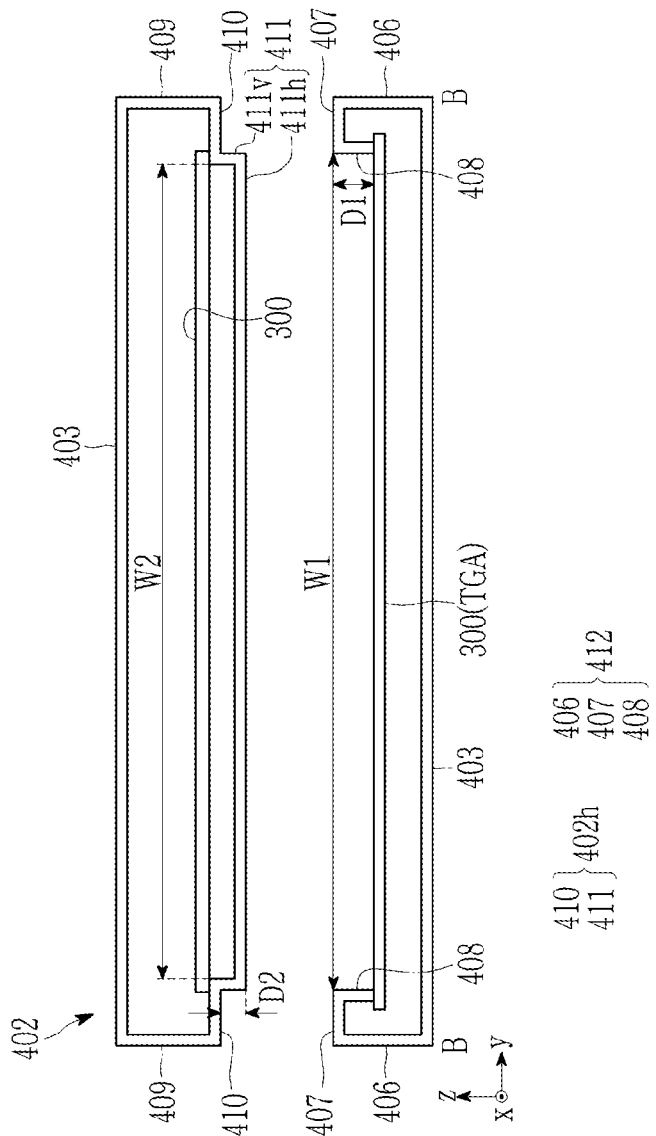
FIG. 5 and FIG. 6 are cross-sectional views of the display device shown in FIG. 1 and FIG. 2, taken along line B-B.

FIG. 1 is a perspective view of a display device 1000 which is unfolded (e.g., in an unfolded state) according to an embodiment, FIG. 2 is a side view of the display device 1000 which is folded (e.g., in a folded state) according to the embodiment, FIG. 3 is a cross-sectional view of a display panel 300 of the display device 1000 which is unfolded, according to the embodiment, FIG. 4 is a cross-sectional view of the display device 1000 shown in FIG. 1 and FIG. 2 which is folded, taken along line A-A, and FIG. 5 is a cross-sectional view of the display device 1000 shown in FIG. 1 and FIG. 2 which is folded, taken along line B-B.

Referring to FIG. 1 and FIG. 2, a display device 1000 according to an embodiment is a foldable display device, and includes a non-folding area including a plurality of unfolded portions FA1, FA2, and FA3 and a folding area including a plurality of folding portions RA1 and RA2. One of the folding portions RA1 or RA2 may be positioned between neighboring unfolded portions FA1, FA2, and FA3. Various components or layers of the display device may have a non-folding area, an unfolded portion, a folding area and/or a folding portion corresponding to those described above. Various components or layers may be foldable together with each other and/or with the display device 1000.

Each of the unfolded portions FA1, FA2, and FA3 may not be folded and may maintain a substantially flat shape. That is, the non-folding area may be an area at which the display device 1000 (or a component or layer) is unfoldable or which remains flat even in the display device 1000 which is folded. The display device 1000 which is unfolded may be disposed in a plane defined by an x-axis direction and a y-axis direction crossing each other. A thickness direction of the display device and various components or layers thereof may be defined along a z-axis direction. The directions introduced above may be variously referred to as a first direction, a second direction and a third direction, without being limited thereto.

Each of the folding portions RA1 and RA2 may be bent and rolled or unfolded in a certain curvature radius range around virtual folding axes RX1 and RX2. That is, the folding area may be an area at which the display device 1000 (or a component or layer) is foldable about an axis (e.g., a folding axis). Each of the folding axes RX1 and RX2 may be an axis extending in the y-axis direction in FIG. 1 and FIG. 2. Each of the folding portions RA1 and RA2 may be rolled or unfolded in (or along) the x-axis direction, and accordingly, the display device 1000 may be folded or unfolded in the x-axis direction as illustrated.

In the present disclosure, an example in which the display device 1000 according to the embodiment includes two folding portions, that is, a first folding portion RA1 and a second folding portion RA2, and the unfolded portions include a first unfolded portion FA1, a second unfolded portion FA2, and a third unfolded portion FA3, will be described. The first folding portion RA1 is positioned between the first unfolded portion FA1 and the second unfolded portion FA2, and the second folding portion RA2 is positioned between the second unfolded portion FA2 and the third unfolded portion FA3. That is, the first unfolded portion FA1, the first folding portion RA1, the second unfolded portion FA2, the second folding portion RA2 and the third unfolded portion FA3 may be in order along the x-axis direction.

The display device 1000 may be first folded in (or at) the first folding portion RA1 and then second folded in the second folding portion RA2. When the display device 1000 is folded in both the first folding portion RA1 and the second folding portion RA2 as shown in FIG. 2, the first unfolded portion FA1, the second unfolded portion FA2, and the third unfolded portion FA3 all overlap in the z-axis direction. That is, the display device 1000 which is folded disposes the first unfolded portion FA1, the second unfolded portion FA2, and the third unfolded portion FA3 overlapping each other along the thickness direction (e.g., the z-axis direction). The first unfolded portion FA1 may be folded in a shape sandwiched between the second unfolded portion FA2 and the third unfolded portion FA3. That is, the display device 1000 which is folded disposes the first unfolded portion FA1 sandwiched between the second unfolded portion FA2 and the third unfolded portion FA3 along the thickness direction.

The display device 1000 includes a display panel 300 including a display element that can display an image (e.g., generates and/or emits light, displays an image, etc.), and a housing structure 400 which is coupled to the display panel 300.

The housing structure 400 may define a predetermined space therein (e.g., a receiving space), and the display panel 300 may be positioned in the predetermined space. However, a bonding structure of the display panel 300 and the housing structure 400 is not limited thereto.

Each of the display panel 300 and the housing structure 400 may include a plurality of unfolded portions FA1, FA2, and FA3 and a plurality of folding portions RA1 and RA2 as described above. The display panel 300 and the housing structure 400 may be foldable together with each other and/or with the display device 1000.

The display panel 300 may be entirely flexible in all of the plurality of unfolded portions FA1, FA2, and FA3 and the plurality of folding portions RA1 and RA2 (e.g., flexible in an entirety of the display panel 300). The display panel 300 may include various display panels such as an organic light emitting panel.

Referring to FIG. 3, the display panel 300 according to the embodiment may include an element layer 100 where a plurality of transistors and a plurality of light emitting elements are formed (or provided) as a display element layer, at least one adhesive layer 51 and at least one thin film 101 that are each disposed above the element layer 100, and at least one adhesive layer 52 and at least one thin film 102 that are disposed below the element layer 100, viewable in a cross-sectional structure in the z-axis direction.

The element layer 100 may include a touch sensor depending on embodiments, such as to include a touch sensor layer.

The adhesive layers 51 and 52 may include at least one of an optically clear adhesive (OCA), an optically clear resin (OCR), and a pressure sensitive adhesive (PSA). The adhesive layers 51 and 52 serve to position and adhere adjacent thin films or films relative to each other.

At least one of the thin films 101 and 102 may be a coated or stacked layer or may include at least one film. At least one of the thin films 101 and 102 may include an optical member, a protection member, a coating layer, a sensing member, and the like.

Referring to FIG. 1 to FIG. 3, the display panel 300 may include a first display plane 300d1 (e.g., a first display surface defined by the display panel 300) that extends widely on the xy plane. The first display plane 300d1 may display an image in the z-axis direction. The first display plane 300d1 may be formed (or provided) at the entire display panel 300 (e.g., an entirety of the display panel 300). That is, the first display plane 300d1 may be included at each of the first unfolded portion FA1, the second unfolded portion FA2, and the third unfolded portion FA3, and the first folding portion RA1 and the second folding portion RA2, but is not limited thereto. The housing structure 400 may not be positioned on an upper portion of the first display plane 300d1 (e.g., may be excluded from the upper portion of the first display plane 300d1 and/or may expose the first display plane 300d1 to outside the housing structure 400.

Referring to FIG. 2 and FIG. 3, depending on embodiments, the display panel 300 may further include a second display plane 300d2 (e.g., a second display surface defined by the display panel 300) that can display an image in the opposite direction to the z-axis direction. The second display plane 300d2 may be formed on the whole or only a part of the display panel 300.

For example, referring to FIG. 2, the second display plane 300d2 is positioned in the third unfolded portion FA3, the second folding portion RA2, or the second unfolded portion FA2 to display an image to the outside even when the display device 1000 is folded. In FIG. 2, the display device 1000 which is folded disposes the second display plane 300d2 at the third unfolded portion FA3, the second folding portion RA2 and/or the second unfolded portion FA2 facing outward, such as to be visible from outside the display device 1000. In this case, the housing structure 400 corresponding to the second display plane 300d2 may be transparent or form a transparent window through which light may be transmitted, such that the image displayed by the second display plane 300d2 is viewable from outside of the display device 1000 which is folded.

When the display device 1000 is folded, the curvature radius R1 (e.g., a first curvature radius) of the first folding portion RA1 in which the display panel 300 is first folded may be smaller than the curvature radius R2 (e.g., a second curvature radius) of the second folding portion RA2 in which the display device 1000 is second folded. That is, the display device 1000 which is folded at the first folding portion RA1 and at the second folding portion RA2 defines the first curvature radius and the second curvature radius, respectively.

Referring to FIG. 2, the housing structure 400 may determine the folding shape of the display device 1000.

The housing structure 400 at each of the first unfolded portion FA1, the second unfolded portion FA2, and the third unfolded portion FA3 may include a body portion 403 (e.g., a bottom portion) having a fixed shape. The body portion 403 extends along and generally parallel to the first display plane 300d1 of the display panel 300 and may have a fixed plane.

The first folding portion RA1 and the second folding portion RA2 of the housing structure 400 may include various structures for enabling the display device 1000 to be folded in the first folding portion RA1 and the second folding portion RA2. For example, the first folding portion RA1 and the second folding portion RA2 of the housing structure 400 may include a plurality of rotatable hinge structures.

The housing structure 400 according to the embodiment includes a first end portion 401 and a second end portion 402 which are respectively opposing ends of the housing structure 400 along the x-axis direction, which is the direction in which the display device 1000 is foldable and/or unfoldable to be folded or unfolded.

The first end 401 may be positioned at an edge (e.g., an outer edge) of the third unfolded portion FA3, and the second end 402 may be positioned at an edge (e.g., an outer edge) of the first unfolded portion FA1. When the display device 1000 is folded in both the first folding portion RA1 and the second folding portion RA2, the first end portion 401 is exposed to the outside the display device 1000 as an external end portion and the second end portion 402 may be positioned inside the display device 1000 as an internal end portion.

Referring to FIG. 1 and FIG. 2, the detailed shapes of the first end 401 and the second end 402 will be described in detail.

The first end portion 401 may include a first side surface portion 401e (e.g., a first end surface) that continues from a first edge or end of the body portion 403 and extends in a different direction from the body portion 403, a first horizontal portion 401h extending from an edge or end of the first side surface portion 401e and extending in a different direction from the first side surface portion 401e, and a first vertical portion 401v that continues from the first horizontal portion 401h and extends in a different direction from an edge or end of the first horizontal portion 401h.

For example, in FIG. 2, the first side surface portion 401e may extend approximately in the yz planar direction, the first horizontal portion 401h may extend in a direction approximately parallel to the first display plane 300d1, that is, in the xy planar direction, and the first vertical portion 401v may extend in a direction parallel to the first side surface portion 401e, that is, in the yz planar direction. An end (e.g., a distal end) of the first vertical portion 401v is protruded toward the display panel 300 from the first horizontal portion 401h such that one end of the display panel 300 can be fixed in position within the display device 1000.

However, the shape of the first end 401 is not limited thereto. According to an embodiment, at least a part (or portion) between the adjacent body portion 403 and the first side surface portion 401e, a portion between the first side surface portion 401e and the first horizontal portion 401h, and a portion between the first horizontal portion 401h and the first vertical portion 401v may form a sharp corner (or edge), or may form a rounded (or chamfered) corner (or edge) thereby forming a curved surface as a whole.

The second end portion 402 may include a second side surface portion 402e (e.g., a second end surface) that continues from a second edge or end of the body portion 403 which is opposite to the first edge thereof and extends in a different direction from the body portion 403, a second horizontal portion 402h that continues from an edge or end of the second side surface portion 402e and extends in a different direction from the second side surface portion 402e, and a second vertical portion 402v that continues from an edge or end of the second horizontal portion 402h and extends in a different direction from the second horizontal portion 402h.

For example, in FIG. 2, the second side surface portion 402e may extend approximately in the yz planar direction, the second horizontal portion 402h may extend approximately in a direction parallel to the first display plane 300d1, that is, in the xy planar direction, and the second vertical portion 402v may extend in a direction parallel to the second side portion 402e, that is, in the yz planar direction. An end (e.g., a distal end) of the second vertical portion 402v is protruded toward the display panel 300 such that the other end of the display panel 300 can be fixed.

However, the shape of the second end portion 402 is not limited thereto. According to an embodiment, at least a part between the adjacent body portion 403 and the second side surface portion 402e, between the second side surface portion 402e and the second horizontal portion 402h, and between the second horizontal portion 402h and the second vertical portion 402v may form a sharp corner, or may form a rounded corner thereby forming a curved surface as a whole.

A length of the second vertical portion 402v of the second end 402 in the z-axis direction is greater than a length of the first vertical portion 401v of the first end 401 in the z-axis direction, and a length of the second side surface portion 402e of the second end portion 402 in the z-axis direction is greater than a length of the first side surface portion 401e of the first end portion 401 in the z-axis direction.

When the display device 1000 is folded in the first folding portion RA1, the second end 402 faces a portion TGA (e.g., a facing portion of the display panel 300) adjacent to the second folding portion RA2 of the second unfolded portion FA2 of the display panel 300 as shown in FIG. 2. When an upper surface of the portion TGA of the display panel 300 is normal (e.g., flat, non-buckled, etc.), the second end 402 may not contact the upper surface of the display panel 300. This will be described in more detail later.

Referring to FIG. 4 and FIG. 5, a structure of the first end portion 401 and the second end portion 402 of the housing structure 400 will be described in detail.

Referring to FIG. 4, when viewed from the cross-section in the yz direction, the first end portion 401 includes a body portion 403 positioned on an upper portion, a first side portion 404 that continues from the body portion 403 and extends in a different direction from the body portion 403 at the left and right sides (e.g., opposing sides along the y-axis direction), and a first horizontal portion 401h that continues from the first side portion 404 and faces the body portion 403.

The first horizontal portion 401h may have a generally flat shape as a whole.

According to an embodiment, at least a part (or portion) between the adjacent body portion 403 and the first side portion 404 and between the first side portion 404 and the first horizontal portion 401h may form a sharp corner, or may form a rounded corner thereby forming a curved surface as a whole.

Referring to FIG. 5, when viewed from the cross-section in the yz direction, the second end portion 402 includes the body portion 403 positioned on an upper portion, a second side portion 409 provided in plural including a plurality of second side portions 409 that continue from the body portion 403 and extend in a different direction from the body portion 403 at the left and right sides, and a second horizontal portion 402h that continues from second side portions 409 and faces the body portion 403.

The second horizontal portion 402h includes edge portions 410 that directly continue with both second side portions 409 and extend in different directions from the second side portions 409, and a protruding portion 411 that is disposed between both edge portions 410 and protrudes below the edge portion 410, that is, protrudes toward the facing display panel 300 (indicated as "300(TGA)" in FIG. 5). The edge portion 410 and the protruding portion 411 may together form a step shape.

The edge portion 410 may extend in a direction substantially parallel to the body portion 403.

When the display device 1000 is folded in the first folding portion RA1, the protruding portion 411 faces the portion TGA of the display panel 300 as shown in FIG. 5. When a top surface of the opposing portion TGA of the display panel 300 is normal, the protruding portion 411 may not contact the top surface of the display panel 300.

The protruding portion 411 may include a protruding side portion 411v continuing from the edge portion 410 and extending in a different direction from the edge portion 410, and a lower protruding portion 411h (e.g., a lower horizontal portion) connecting with the side protruding portion 411v and extending in a different direction from the side protruding portion 411v. A portion where the side protruding portion 411v and the lower protruding portion 411h meet may form a corner. For example, the side protruding portion 411v may be approximately parallel to the second side portion 409, and the lower protruding portion 411h may be approximately parallel to the body portion 403. Accordingly, the protruding portion 411 may have an approximately rectangular parallelepiped shape.

According to an embodiment, at least a part between the adjacent body portion 403 and the second side portion 409, between the second side portion 409 and the edge portion 410, between the edge portion 410 and the side protruding portion 411v, and between the side protruding portion 411v and the lower protruding portion 411h may form a sharp corner, or may form a rounded corner thereby forming a curved surface as a whole.

Referring to the bottom view in FIG. 5, the housing structure 400 overlapping the display panel 300 in the z-axis direction may have a shape surrounding the lower surface and the side surface of the display panel 300 except for the first end portion 401 and the second end portion 402 of the display panel 300.

Specifically, the housing structure 400 overlapping the display panel 300 may include protruding portions 412 on both sides positioned at opposing edges of the display panel 300 as shown in FIG. 5. In particular, the second unfolded portion FA2 of the housing structure 400 may include protruding portions 412 on both sides positioned on the edge of the display panel 300. In an embodiment, the structure of the bottom view in FIG. 5 may apply to the housing structure 400 at intermediate locations along the display panel 300 except for locations at the first end portion 401 and the second end portion 402, without being limited thereto. That is, while the housing structure 400 has the configurations shown in FIG. 4 and the top view of FIG. 5 at the first end portion 401 and the second end portion 402, respectively, a remainder of the housing structure 400 at a remaining portion between the two end portions may have the configuration shown in the bottom view of FIG. 5, without being limited thereto.

The protruding portion 412 may include a body portion 403 that faces the display panel 300 in the z-axis direction, third side portions 406 continuing from the body portion 403 and extending in a different direction from the body portion 403, third horizontal portions 407 continuing from the third side portions 406 and extending in a different direction from the third side portion 406, and third vertical portions 408 continuing from the third horizontal portions 407 and extending in a different direction from the third horizontal direction 407.

For example, in FIG. 5, the third side portion 406 may extend approximately in the zx planar direction, the third horizontal portion 407 may extend in a direction approximately parallel to the first display plane 300d1, that is, in the xy planar direction, and the third vertical portion 408 may extend in a direction parallel to the third lateral 406, that is, in the zx planar direction. An end of the third vertical portion 408 is protruded toward the display panel 300 such that one end of the display panel 300 can be fixed.

However, the shape of a portion of the housing structure 400 overlapping the display panel 300 is not limited thereto. According to an embodiment, at least a part between the adjacent body part 403 and the third side portion 406, between the third side portion 406 and the third horizontal portion 407, and between the third horizontal portion 407 and the third vertical portion 408 may form a sharp corner, or may form a rounded corner thereby forming a curved surface as a whole.

Referring to FIG. 2 and FIG. 5, when the display device 1000 is fully folded in the first folding portion RA1, an edge portion 410 of the upper housing structure 400 at the second end portion 402 and the third horizontal portion 407 of the protruding portion 412 of the lower housing structure 400 at the intermediate portion thereof may face each other, and may contact each other depending on embodiments.

When the display device 1000 is bent and folded in the first folding portion RA1 and the second folding portion RA2, the display panel 300 is folded twice in the same direction, and thus stress is relatively high particularly in the portion TGA adjacent to the second folding portion RA2 of the second unfolded portion FA2 of the display panel 300. Accordingly, when the display device 1000 is repeatedly folded and unfolded, there is a high risk of a buckling defect in which the upper surface of the portion TGA of the display panel 300 protrudes upward. For example, the adhesive layers 51 and 52 positioned between the thin films 101 and 102 positioned on the portion TGA of the display panel 300 may be damaged due to repeated folding of the display device 1000, and at least a portion of the thin film 101 positioned on upper portions of the damaged adhesive layers 51 and 52 may be lifted upward and buckling may occur.

When the portion TGA of the display panel 300 according to the embodiment is normal, when the display device is folded in the first folding portion RA1, the protruding portion 411 of the upper housing structure 400 does not contact the upper surface of the portion TGA of the facing display panel 300. A second distance (or second height) in the z-axis direction of the protruding portion 411 in FIG. 5 may be smaller than a first distance D1 (or first height) between the upper surface of the portion TGA of the facing display panel 300 therebelow and the upper surface of the third horizontal portion 407 of the housing structure 400. Accordingly, when the display device is fully folded in the first folding portion RA1 in a state where the upper surface of the portion TGA of the display panel 300 is normal, defects such as pressing of the upper surface of the 300 that may occur when the protruding portion 411 of the housing structure 400 repeatedly contacts the upper surface of the display panel 300 can be prevented. That is, the display device 1000 which is folded at the first folding portion RA1 may dispose the protruding portion 411 at the second end portion 402 facing and/or nested within a recess defined by the protruding portions 412 together with the portion TGA of the display panel 300. Owing to the second distance being smaller than a first distance D1, the display device 1000 which is folded disposes the protruding portion 411 and the portion TGA of the display panel 300 non-contacting each other or spaced apart from each other in the z-axis direction.

When a defect occurs and thus a protruding portion is formed in the z-axis direction like buckling on the upper surface of the portion TGA of the display panel 300 (e.g., not normal, not flat, etc.), the protruding portion 411 of the upper housing structure 400 may contact at least a part of the upper surface of the portion TGA of the facing display panel 300 when the first folding portion RA1 is fully folded. Through this, it is possible to suppress the deformation of the buckled portion of the part TGA of the display panel 300 by being further protruded in the z-axis direction. That is, the display device 1000 which is folded at the first folding portion RA1 may dispose the protruding portion 411 at the second end portion 402 nested within the recess defined by the protruding portions 412 together with the portion TGA of the display panel 300. Owing to the buckling of the upper surface of the portion TGA of the display panel 300, the display device 1000 which is folded disposes the protruding portion 411 and the portion TGA of the display panel 300 in contact with each other to suppress the deformation at the buckled portion of the part TGA of the display panel 300.

The housing structure 400 may include a metal material having a selected degree of rigidity to support the display panel 300, and a non-metal material such as a polymer, ceramic, and an elastomer. For example, most of the body portion 403 may be formed of a material having rigidity, and the protruding portion 411 that may contact the upper surface of the portion TGA of the display panel 300 may be formed of a low-modulus material such as an elastomer. Specifically, the modulus of the protruding portion 411 may be lower than the modulus of the upper surface of the portion TGA of the display panel 300. For example, the modulus of the protruding portion 411 may be about 700 megapascals (MPa) or less, but is not limited thereto.

Referring to FIG. 5, a second width W2 in the y-axis direction of the protruding portion 411 of the housing structure 400 is smaller than a first width W1 of the recess between the two opposing third vertical portions 408 of the housing structure 400 facing the display device when the display device 1000 is folded. In an embodiment, a width of the protruding portion 411 of the housing structure 400 taken between outer surfaces of the protruding side portions 411v may be smaller than the first width W1 of the recess between the two opposing third vertical portions 408 of the housing structure 400 facing the display device when the display device 1000 is folded.

Referring to FIGS. 2 and 5 together, for example, the display device 1000 may include a housing structure 400 which extends along the display panel 300 and is coupled with the display panel 300, and the housing structure 400 is foldable together with the display panel 300. The housing structure 400 includes a first end portion 401 and a second end portion 402 respectively corresponding to opposing ends of the display panel 300 (e.g., along the x-axis direction in FIGS. 1 and 2). The second end portion 402 includes a first protruding portion (e.g., 411v and 411h) having a distal end (e.g., surface along 411h). The second end portion 402, a first folding portion RA1, a non-folding portion including a second protruding portion (e.g., 406 and 407 in FIG. 5) defining a recess (e.g., between left 408 and right 408 in FIG. 5) of the non-folding portion which exposes a non-folding portion (e.g., TGA) of the display panel 300 to outside the housing structure 400, a second folding portion RA2 and the first end portion 401 in order in a direction along the display panel 300 (e.g., along the x-axis direction). A boundary is between the non-folding portion (e.g., dotted line in FIG. 5 near TGA) and the second folding portion RA2 and corresponds to the non-folding portion of the display panel 300 The display panel 300 which is folded disposes the first protruding portion of the second end portion 402 at the boundary between the non-folding portion and the second folding portion RA2, and facing and spaced apart from the non-folding portion (e.g., at TGA) of the display panel 300 which is at the boundary.

Referring to FIGS. 1, 2 and 5 together, for example, a display device 1000 includes a first portion (e.g., including 402 up to RA1), a folding portion (e.g., at RA1) at which the display device 1000 is foldable, and a second portion (e.g., including 403 after RA1 and through 401) in order along a first direction (e.g., an x-axis direction), a display panel 300 which is foldable and extends along each of the first portion, the folding portion and the second portion. The first portion includes a first housing structure (e.g., at 402) which includes a first horizontal portion (e.g., 403, 409 and 410), the first horizontal portion including edge portions 410 opposite to each other along a second direction crossing the first direction (e.g., along the y-axis direction), and a first protruding portion (e.g., 411v and 411h) between the edge portions 410 and protruding further than the edge portions 410 in a direction away from the display panel 300 at the first portion. The second portion includes a second housing structure (e.g., intermediate area shown in the bottom view of FIG. 5) which surrounds a bottom surface and side surfaces of the display panel 300 at the second portion, the second housing structure includes second protruding portions (e.g., 406 and 407) opposite to each other along the second direction and corresponding to the side surfaces of the display panel. The display device 1000 which is folded at the folding portion (e.g., at RA1) disposes the first portion facing the second portion, the first horizontal portion (e.g., bottom surface of 411v and 411h) of the first housing structure facing the display panel 300 (e.g., at TGA) at the second portion, and the second protruding portion of the second housing structure facing the edge portions 410 of the first housing structure.

Referring again to FIGS. 2 and 5 together, for example, each of the display panel 300 and the housing structure 400 includes a plurality of unfolded portions including a first unfolded portion FA1, a second unfolded portion FA2 and a third unfolded portion FA3, in order along a first direction (e.g., the x-axis direction). A first folding portion RA1 is between the first unfolded portion FA1 and the second unfolded portion FA2, and a second folding portion RA2 is between the second unfolded portion FA2 and the third unfolded portion FA3. A first end portion 401 corresponds to an outer edge of the third unfolded portion FA3 (e.g., rightmost edge in FIG. 1), and a second end portion 402 corresponds to an outer edge of the first unfolded portion (e.g., leftmost edge in FIG. 1. The second end portion 402 of the housing structure 400 further includes a body portion 403 (in FIG. 5), and a first horizontal portion of the second end portion 402 (e.g., 411h) which faces the body portion 403. The first horizontal portion of the second end portion 402 includes edge portions 410 which extend from the body portion 403 and face each other along a second direction (e.g., y-axis direction) crossing the first direction, and a first protruding portion (e.g., 411v and 411h) which extends from the edge portions 410, is between the edge portions 410 and protruded further from the edge portions 410 in a direction away from the body portion 403 (e.g., opposite to the z-axis direction in FIG. 5). The display panel 300 which is folded disposes the first protruding portion (e.g., 411v and 411h) of the second end portion 402 of the housing structure 400 facing a first portion (e.g., at TGA) of the second unfolded portion FA2 of the display panel 300.

Figure 6:
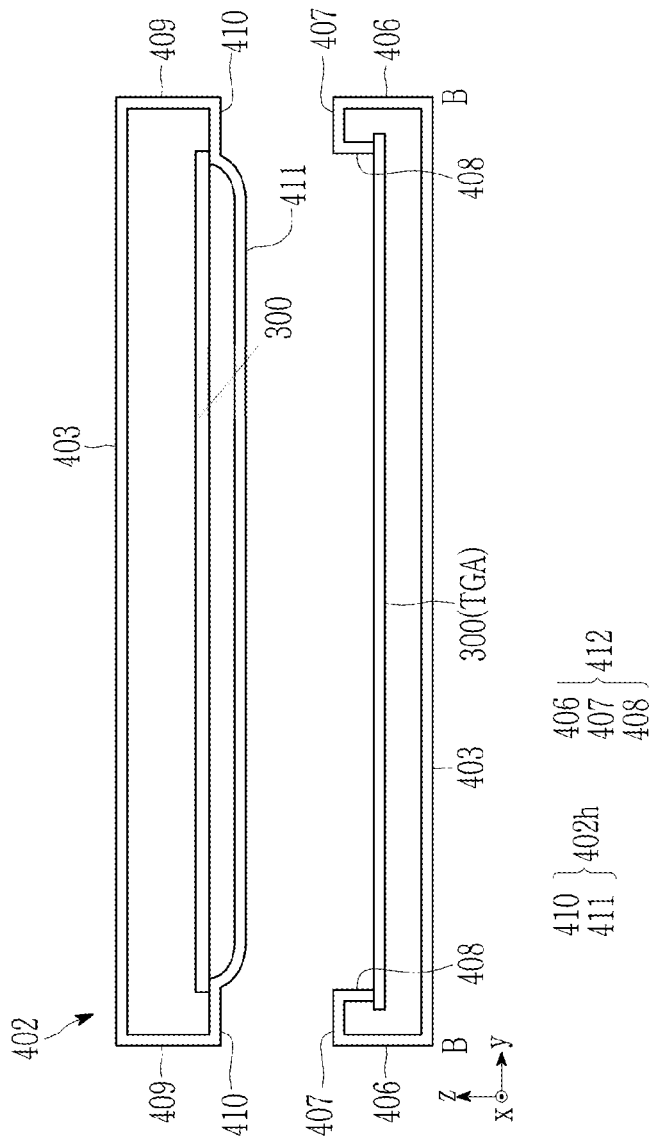

FIG. 6 is a cross-sectional view of the display device 1000 shown in FIG. 1 and FIG. 2, taken along the line B-B.

A display device 1000 according to an embodiment in FIG. 6 is almost the same as the display device 1000 according to the embodiment described with reference to FIG. 1 to FIG. 5, except for the shape of the protruding portion 411. A protruding portion 411 according to the present embodiment may have a curved surface rather than having a corner on an edge portion. Accordingly, when the protruding portion 411 contacts an upper surface of the facing display panel 300, the pressure and damage that may be applied to the upper surface of the display panel 300 can be reduced.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:
   a display panel which is foldable;
   a housing structure which is coupled with the display panel and foldable together with the display panel;
   each of the display panel and the housing structure comprising:
     a plurality of unfolded portions including a first unfolded portion, a second unfolded portion, and a third unfolded portion, in order along a first direction;
     a first folding portion between the first unfolded portion and the second unfolded portion;
     a second folding portion between the second unfolded portion and the third unfolded portion;
     a first end portion corresponding to an outer edge of the third unfolded portion; and
     a second end portion corresponding to an outer edge of the first unfolded portion; and
   the second end portion of the housing structure further comprising:
     a body portion; and
     a first horizontal portion which faces the body portion, the first horizontal portion including:
       edge portions which extend from the body portion and face each other along a second direction crossing the first direction, and
       a first protruding portion which extends from the edge portions, is between the edge portions and protruded further from the edge portions in a direction away from the body portion;
   wherein the display panel which is folded disposes the first protruding portion of the second end portion of the housing structure facing a first portion of the second unfolded portion of the display panel.

2. The display device of claim 1, wherein the display panel which is folded at the first folding portion further disposes the first protruding portion of the second end portion of the housing structure closer to the first portion of the second unfolded portion of the display panel than the body portion of the second end portion of the housing structure.

3. The display device of claim 2, wherein the second unfolded portion of the housing structure comprises a second protruding portion at opposite edges of the display panel along the second direction.

4. The display device of claim 3, wherein the display panel which is folded at the first folding portion further disposes the second protruding portion facing the edge portions of the first horizontal portion.

5. The display device of claim 4, wherein the display panel which is folded at the first folding portion further disposes the second protruding portion contacting the edge portions of the first horizontal portion.

6. The display device of claim 3, wherein
   each of the first protruding portion and the second protruding portion has a height along a thickness direction of the display device, and
   the height of the first protruding portion is smaller than the height of the second protruding portion.

7. The display device of claim 6, wherein the display panel which is folded at the first folding portion further disposes the first protruding portion non-contacting the first portion of the second unfolded portion of the display panel.

8. The display device of claim 7, wherein
the first portion of the second unfolded portion of the display panel is deformable, and
the display panel which is folded at the first folding portion further disposes the first protruding portion contacting the first portion of the second unfolded portion of the display panel which is deformed.

9. The display device of claim 2, wherein the first protruding portion comprises:
a side protruding portion which extends from the edge portions and protrudes in a different direction from a direction in which the edge portions extend, and
a lower protruding portion which extends from the side protruding portion and extends in a different direction from the side protruding portion.

10. The display device of claim 9, wherein the edge portions and the first protruding portion together form a stepped shape.

11. The display device of claim 2, wherein the first protruding portion has a lower surface which furthest from the body portion and curved.

12. The display device of claim 1, wherein a modulus of the first protruding portion is lower than a modulus of the first portion of the display panel.

13. The display device of claim 1, wherein the display panel which is folded at the first folding portion and at the second folding portion disposes the third unfolded portion of the display panel, the second end portion of the housing structure and the first portion of the second unfolded portion of the display panel, in order along a thickness direction of the display device.

14. The display device of claim 13, wherein the display panel which is folded at the first folding portion and at the second folding portion defines a curvature radius of the first folding portion which is smaller than a curvature radius of the second folding portion.

15. The display device of claim 1, wherein the display panel which is folded disposes the plurality of unfolded portions of the housing structure having a flat shape.

16. A display device comprising:
a first portion, a folding portion at which the display device is foldable, and a second portion in order along a first direction,
a display panel which is foldable and extends along each of the first portion, the folding portion and the second portion,
the first portion comprising a first housing structure which includes a first horizontal portion, the first horizontal portion comprising edge portions opposite to each other along a second direction crossing the first direction, and a first protruding portion between the edge portions and protruding further than the edge portions in a direction away from the display panel at the first portion,
the second portion comprising a second housing structure which surrounds a bottom surface and side surfaces of the display panel at the second portion, the second housing structure comprising second protruding portions opposite to each other along the second direction and corresponding to the side surfaces of the display panel,
wherein the display device which is folded at the folding portion disposes:
the first portion facing the second portion,
the first horizontal portion of the first housing structure facing the display panel at the second portion, and
the second protruding portion of the second housing structure facing the edge portions of the first housing structure.

17. The display device of claim 16, wherein the display device which is folded at the folding portion further disposes the second protruding portion contacting the edge portions of the first housing structure.

18. The display device of claim 16, wherein
each of the first protruding portion and the second protruding portion has a height along a thickness direction of the display device, and
the height of the first protruding portion is smaller than the height of the second protruding portion.

19. The display device of claim 16, wherein a modulus of the first protruding portion is lower than a modulus of the display panel.

20. A display device comprising:
a display panel which is foldable; and
a housing structure which extends along the display panel and is coupled with the display panel, the housing structure foldable together with the display panel,
wherein the housing structure comprises:
a first end portion and a second end portion respectively corresponding to opposing ends of the display panel,
the second end portion comprising a first protruding portion having a distal end,
the second end portion, a first folding portion, a non-folding portion comprising a second protruding portion defining a recess of the non-folding portion which exposes a non-folding portion of the display panel to outside the housing structure, a second folding portion and the first end portion in order in a direction along the display panel,
a boundary which is between the non-folding portion and the second folding portion and corresponds to the non-folding portion of the display panel,
wherein the display panel which is folded disposes the first protruding portion of the second end portion at the boundary between the non-folding portion and the second folding portion, and facing and spaced apart from the non-folding portion of the display panel which is at the boundary.

\* \* \* \* \*